United States Patent
Aigner et al.

(10) Patent No.: US 9,219,517 B2
(45) Date of Patent: Dec. 22, 2015

(54) TEMPERATURE COMPENSATED BULK ACOUSTIC WAVE DEVICES USING OVER-MODED ACOUSTIC REFLECTOR LAYERS

(71) Applicant: TriQuint Semiconductor, Inc., Hillsboro, OR (US)

(72) Inventors: Robert Aigner, Ocoee, FL (US); Alireza Tajic, Winter Springs, FL (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 33 days.

(21) Appl. No.: 14/044,782

(22) Filed: Oct. 2, 2013

(65) Prior Publication Data
US 2015/0094000 A1    Apr. 2, 2015

(51) Int. Cl.
*H03H 9/17* (2006.01)
*H01L 41/22* (2013.01)
*H04B 1/40* (2015.01)
*H03H 3/02* (2006.01)
*H03H 9/02* (2006.01)

(52) U.S. Cl.
CPC . *H04B 1/40* (2013.01); *H03H 3/02* (2013.01); *H03H 9/02102* (2013.01); *H03H 9/175* (2013.01); *H03H 2003/025* (2013.01)

(58) Field of Classification Search
USPC .......................... 333/186, 187, 188; 455/307
See application file for complete search history.

(56) References Cited

U.S. PATENT DOCUMENTS

| | | | |
|---|---|---|---|
| 6,107,721 | A | 8/2000 | Lakin |
| 6,420,820 | B1 | 7/2002 | Larson, III |
| 6,933,807 | B2 | 8/2005 | Marksteiner et al. |
| 7,408,428 | B2 | 8/2008 | Larson, III |
| 7,439,824 | B2 | 10/2008 | Aigner et al. |
| 7,486,006 | B2 | 2/2009 | Aigner |
| 8,253,513 | B2 | 8/2012 | Zhang |
| 8,593,234 | B2 * | 11/2013 | Bar et al. ................ 333/187 |
| 2008/0204857 | A1 * | 8/2008 | Godshalk et al. ........ 359/305 |
| 2008/0258845 | A1 * | 10/2008 | Schmidhammer ........ 333/195 |
| 2011/0080233 | A1 * | 4/2011 | Petit et al. ................ 333/187 |

OTHER PUBLICATIONS

Hashimoto, K., "RF bulk acoustic wave filters for communications," Artch house, Boston-London, 2009, pp. 31-34.

* cited by examiner

*Primary Examiner* — Blane J Jackson
(74) *Attorney, Agent, or Firm* — Withrow & Terranova, P.L.L.C.

(57) ABSTRACT

Embodiments of apparatuses, systems and methods relating to temperature compensated bulk acoustic wave devices. In some embodiments, temperature compensated bulk acoustic wave devices are described with an over-moded reflector layer.

22 Claims, 5 Drawing Sheets

TEMPERATURE COMPENSATED BULK ACOUSTIC WAVE DEVICES USING OVER-MODED ACOUSTIC REFLECTOR LAYERS

TECHNICAL FIELD

Embodiments of the present invention relate generally to the field of acoustic resonators, and more particularly, to temperature compensation of bulk acoustic wave devices using over-moded acoustic reflector layers.

BACKGROUND

Recently released wireless communication bands require filters with extremely steep transitions from passband to adjacent neighboring bands. The most demanding bands may only be served with high-performance filters that have been temperature compensated to have essentially zero temperature drift. Known temperature compensation techniques are associated with a variety of challenges.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

In various embodiments, the phrase "a first layer formed on a second layer," may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Embodiments of the present invention describe temperature compensated (TC) bulk acoustic wave (BAW) devices using over-moded acoustic reflector layers. In some embodiments, a thickness of a top reflector layer may be adjusted so that it includes approximately 30% of the energy of an acoustic wave passing through the BAW device at a given point in time. This may provide desired temperature compensation without many of the drawbacks associated with conventional TC BAW devices. Desired temperature compensation may be understood to be reduced or eliminated temperature drift. Temperature drift may be a change in operating characteristics of the BAW devices related to a change in temperature.

Figure 1:
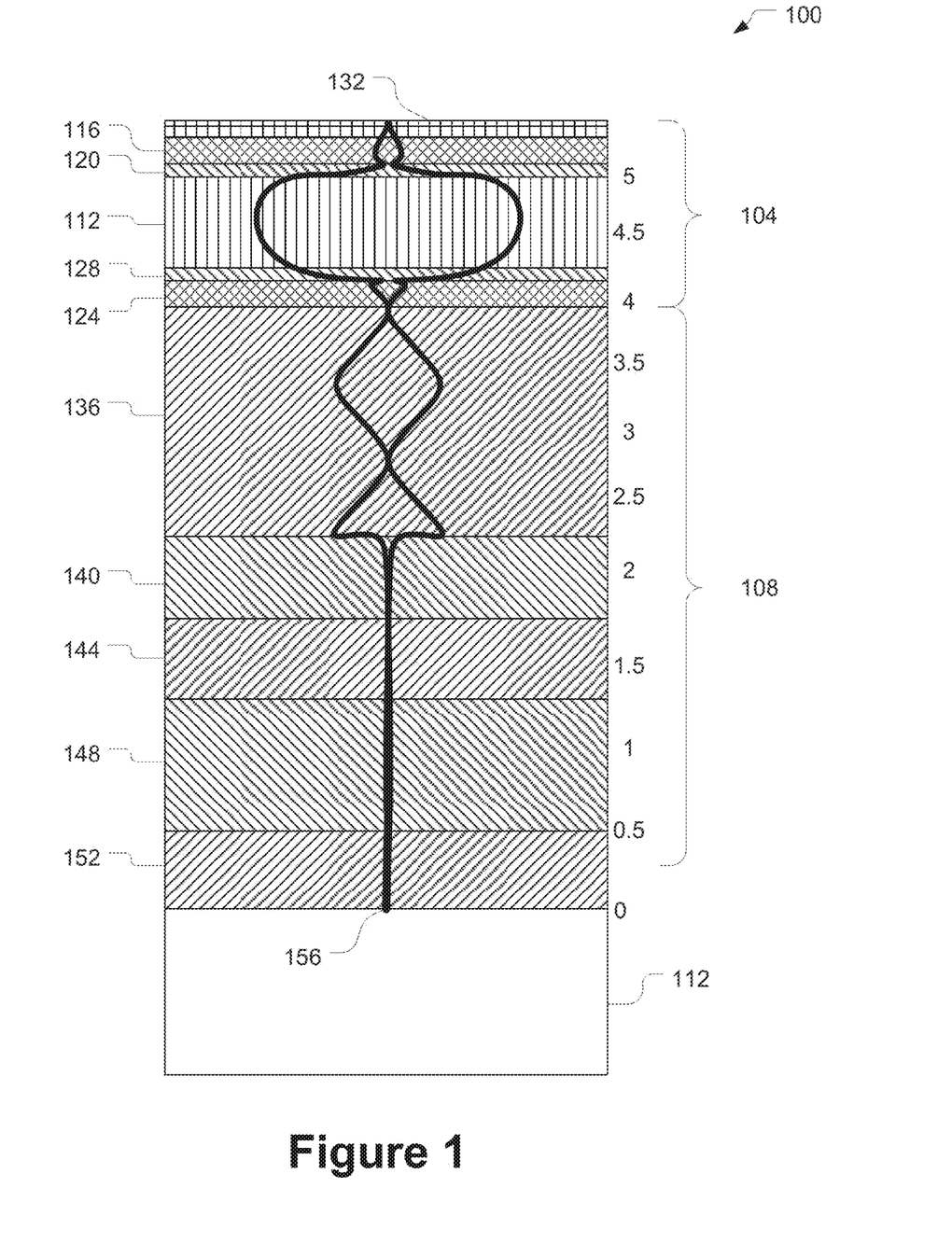
FIG. 1 illustrates a temperature-compensated bulk acoustic wave device in accordance with some embodiments.

FIG. 1 illustrates a BAW device 100 in accordance with various embodiments. The BAW device 100 may include a resonator 104 coupled with a reflector stack 108. The reflector stack 108 may be disposed on a substrate 112. The BAW device 100 may be referred to as a solidly mounted resonator (SMR) in some embodiments.

The resonator 104 may generally include a piezoelectric layer coupled with and between a pair of electrodes. The resonator 104 may be an electromechanical transducer configured to convert energy between an acoustic wave form and an electrical form. The resonator 104 may oscillate at certain frequencies, called resonance frequencies, with a greater amplitude than at other frequencies. The resonator 104 may generate an electrical signal that corresponds to the oscillations, or, conversely, generate oscillations that correspond to an electrical signal.

In some embodiments, the piezoelectric layer may include an aluminum nitride (AlN) layer 112, a top electrode may include an aluminum copper (AlCu) layer 116 and a tungsten (W) layer 120, and a bottom electrode may include an AlCu layer 124 and a W layer 128.

It may be noted that orientation-specific descriptors such as top and bottom are provided to facilitate discussion of the accompanying figures. These descriptors are not intended to limit embodiments of the present invention in any way. Furthermore, while specific materials may be discussed within the layers of the BAW device 100, other embodiments may use additional or alternative materials. In general, the selection of the material may depend on the specific details of a particular embodiment and may be selected based on considerations such as performance, manufacturability, and reliability.

In some embodiments, an insulating layer may be formed over the top electrode. The insulating layer may be, for example, a silicon nitride (SiN) layer 132.

In some embodiments, the reflector 108 may be an acoustic Bragg reflector that includes layers having different acoustic impedances due, for example, to different acoustical velocities or mass density associated with the materials. For example, in some embodiments, the reflector 108 may include alternating silicon dioxide (SiO2) and W layers. The SiO2 layer may have a relatively low acoustical impedance while the W layer may have a relatively high acoustical impedance. As shown, the reflector 108 may include SiO2 layer 136, W layer 140, SiO2 layer 144, W layer 148, and SiO2 layer 152. A scale on the right side of the BAW device 100 in FIG. 1 illustrates approximate distances, in meters× $10^{-6}$, from the substrate 112.

In a conventional BAW device, the layers of a reflector may have thicknesses of approximately ¼ wavelength to provide performance that approaches a free surface, which is found, for example, in a film bulk acoustic resonator (FBAR). Hereinafter, reference to a wavelength may refer to an acoustic longitudinal wavelength at a frequency of a main resonance of the BAW device. An upper-most SiO2 layer of a conventional BAW device, having a thickness of approximately ¼ wavelength, may have approximately 10% of the energy of an acoustic wave and may provide at least some temperature-compensating effect.

A conventional TC BAW device may provide a SiO2 layer within the resonator that will store another 20% of the energy of the acoustic wave (hereinafter "acoustical energy"). Providing a SiO2 layer in the resonator may dramatically affect the coupling coefficient. This may be due to the dielectric nature of the SiO2 constituting a capacitive voltage divider that lowers the driver voltage available across the piezoelectric layer. Thus, the coupling coefficient is reduced by both the energy stored in the SiO2 layer, which is needed for temperature compensation, and the drive voltage lost across the SiO2, which is not needed for temperature compensation.

Further, providing a thin SiO2 layer in the resonator may also be associated with processing challenges. For example, the thin SiO2 layer may be very sensitive, with small deviations in thickness or material parameters causing a severe variation in frequency and a temperature coefficient of frequency (TCF).

Still further, having 20% of the acoustical energy in a thin SiO2 layer may result in a very high energy density. This may result in the mechanical stress in the thin SiO2 layer exceeding the stress in all of the other layers, thereby degrading the reliability of the device when operating at higher transmit powers.

In contrast to the modification of the resonator layers, the BAW device 100 may provide the desired temperature compensation by modifying the SiO2 layer 136 of the reflector 108 to include approximately 30% of the acoustical energy. The acoustical energy, measured in Joules per cubic meter (J/m³), distributed within the BAW device 100 may be represented by line 156. The acoustical energy within SiO2 layer 136 may represent 30% of total acoustical energy through the BAW device 100. In some embodiments, the SiO2 layer 136 may include approximately 20% or more of the total acoustic energy.

In some embodiments, including 30% of the acoustical energy in the SiO2 layer 136 may be done by providing the layer with a thickness of approximately ½ wavelength or greater. A thickness, as described herein, may be a dimension of a layer perpendicular to a major face of the substrate. This may be an upward direction as shown in the figures.

In some embodiments, the thickness of the SiO2 layer 136 may be between approximately ¾ wavelength and ⅘ wavelength. This may set the SiO2 layer 136 in an over-moded configuration. At the operating frequency of the BAW device 100, the acoustic energy distribution in the layers above the SiO2 layer 136, for example, the layers of the resonator 104, may be unchanged. Thus, the proper operation of the resonator 104 may be maintained.

In contrast to thin, SiO2 layer in the resonators of conventional TC devices, the relatively thick SiO2 layer 136 in the reflector 108 may be very homogenous throughout its thickness and well controlled in all parameters. Further, the thickness of the layer 136 may spread the energy over a greater area, thereby avoiding the same degree of stresses as the thin SiO2 layer of the conventional TC devices.

Operational details of the BAW device 100 may be as follows in accordance with some embodiments. The BAW device 100 may have a Q-factor of approximately 1700 as compared to a Q-factor of approximately 1000 for a conventional TC BAW device. The increased Q-factor as compared to the conventional TC BAW device may result from challenges associated with growing a top electrode on a SiO2 device as is done with the conventional TC BAW device. In contrast, the embodiments of the present invention grow all layers on same interfaces used in conventional non-TC SMR BAW devices, which may be associated with very high Q-factors, e.g., approximately 2000.

The BAW device 100 may have a coupling coefficient, $k^2_{eff}$, of approximately 5% as compared to a $k^2_{eff}$ of approximately 3.5% for a conventional TC BAW device. The increased coupling coefficient, as compared to the conventional TC BAW device, may be derived, in part, by the fact that the BAW device 100 does not lose drive voltage across a SiO2 layer within the resonator 104.

In some embodiments, the increased coupling coefficient of the BAW device 100 may help it to achieve a well-matched passband that is wide enough for bands having higher relative bandwidth requirements, for example, evolved-universal terrestrial radio access (E-UTRA) Band 7.

The BAW device 100 may have a TCF of between approximately −2 and 0 ppm/C (as compared to a TCF of between approximately −10 and 0 ppm/C for a conventional TC BAW device and approximately −17 ppm/C for a conventional, non-TC SMR BAW device).

In some instances, the uppermost reflector layer in an SMR-BAW device may cause an additional resonance mode at frequencies typically 50% higher than the main operating frequency. This mode may sometimes be referred to as a mirror mode. Usually, the mirror mode is too small to cause any problems in the filters. However, when providing the SiO2 layer 136 with the described thickness, it may have more than one mirror modes and, thus, be "over-moded." In particular, when setting the thickness of the SiO2 layer 136 at, for example, ¾ wavelength, the SiO2 layer 136 may include one resonance mode at approximately 30% lower than the main operating frequency and another resonance mode at approximately 30% higher than the main operating frequency. Both mirror modes may be more pronounced than a mirror mode in a conventional SMR-BAW filter. Embodiments of the present invention may be configured to address these mirror modes if they become an issue in a particular filter application.

Figure 2:
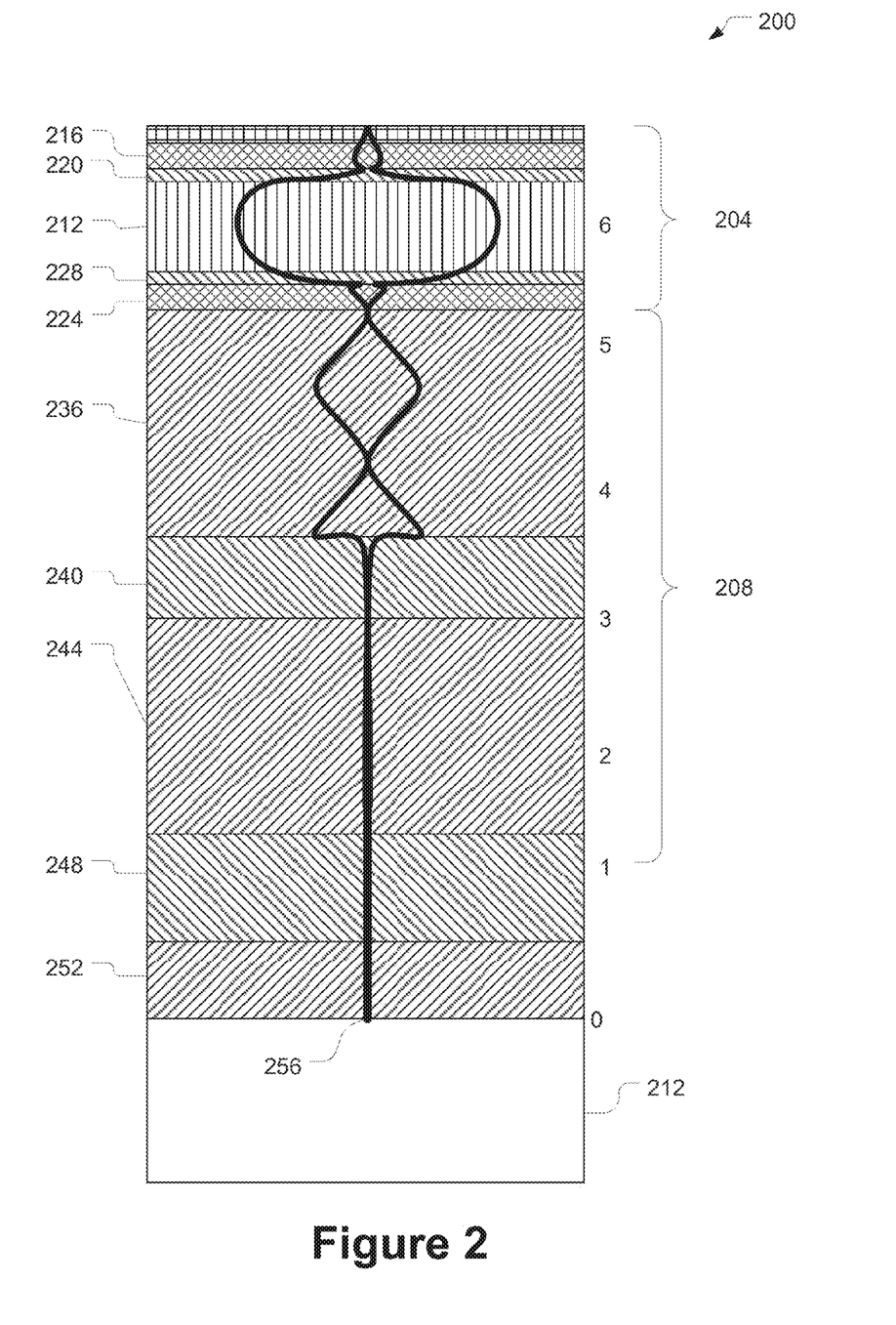
FIG. 2 illustrates another temperature-compensated bulk acoustic wave device in accordance with some embodiments.

FIG. 2 illustrates a BAW device 200 in accordance with some embodiments. The BAW device 200 may be similar to BAW device 100 except for differences noted herein.

The BAW device 200 may include, as a topmost layer of the reflector stack 208, an over-moded layer such as SiO2 layer

236, similar to BAW device 100. However, BAW device 200 may also include another over-moded layer, for example, SiO2 layer 244. In this embodiment, the SiO2 layer 244 may have a thickness of approximately ½ wavelength or greater. In some embodiments, the thickness may be between approximately ¾ wavelength and ⅘ wavelength. Depending on desired operation of the BAW device 200, the thickness of SiO2 layer 244 may be the same as, similar to, or different from the thickness of SiO2 layer 236.

Figure 3:
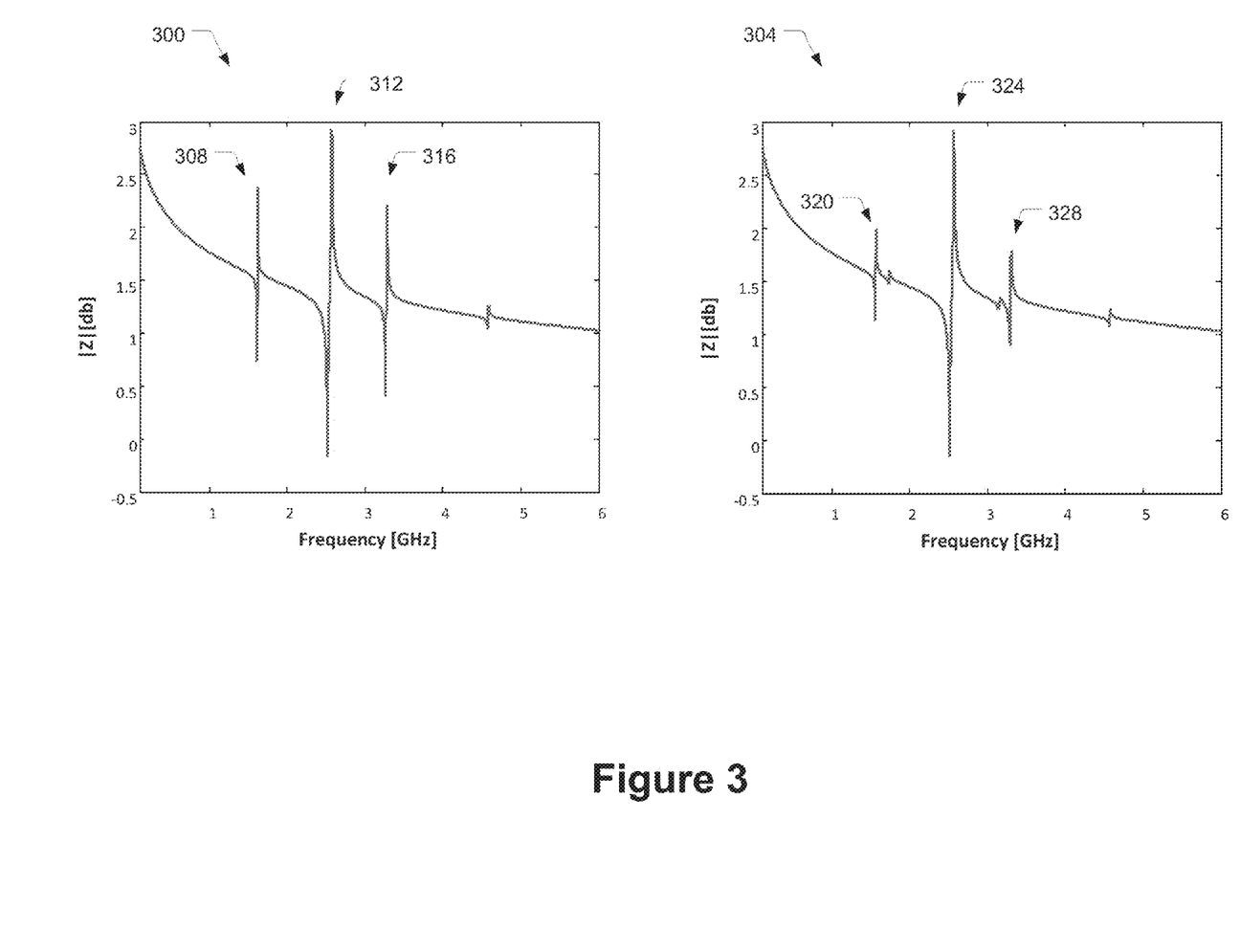
FIG. 3 illustrates graphs depicting impedance characteristics of temperature-compensated bulk acoustic wave devices in accordance with some embodiments.

Choosing an over-moded thickness in reflector layers in addition to the topmost reflector layer may facilitate a reduction of the strength of any mirror modes that may be present. For example, FIG. 3 illustrates graphs 300 and 304 respectively illustrating impedance characteristics of a BAW device with one over-moded layer in the reflector stack, for example, BAW device 100, and a BAW device with two over-moded layers in the reflector stack.

In graph 300, a first mirror mode 308 may be seen at approximately 1 GHz below a main mode 312. Graph 300 also shows a second mirror mode 316, which may be approximately 800 MHz above the main mode 312.

Graph 304 also shows a first mirror mode 320, a main mode 324, and a second mirror mode 328. The modes of graph 304 are shown at generally the same frequencies as the corresponding modes of graph 300. However, as can be seen, the mirror modes 320 and 328 have a reduced strength as compared to mirror modes 308 and 316. This reduction of strength may be due to an interaction between the two over-moded layers that results in a split-up of the modes in sub-modes, which are much weaker. For example, the acoustic energy present at the frequency of the mirror modes can leak out towards the substrate, leading to lower quality factors for the mirror modes.

While the BAW device 200 provides another over-moded reflector layer to facilitate a reduction of a magnitude the mirror modes, other embodiments may adjust thicknesses of the SiO2 reflector layers by a smaller degree in order to prevent creation of parasitic passbands.

Figure 4:
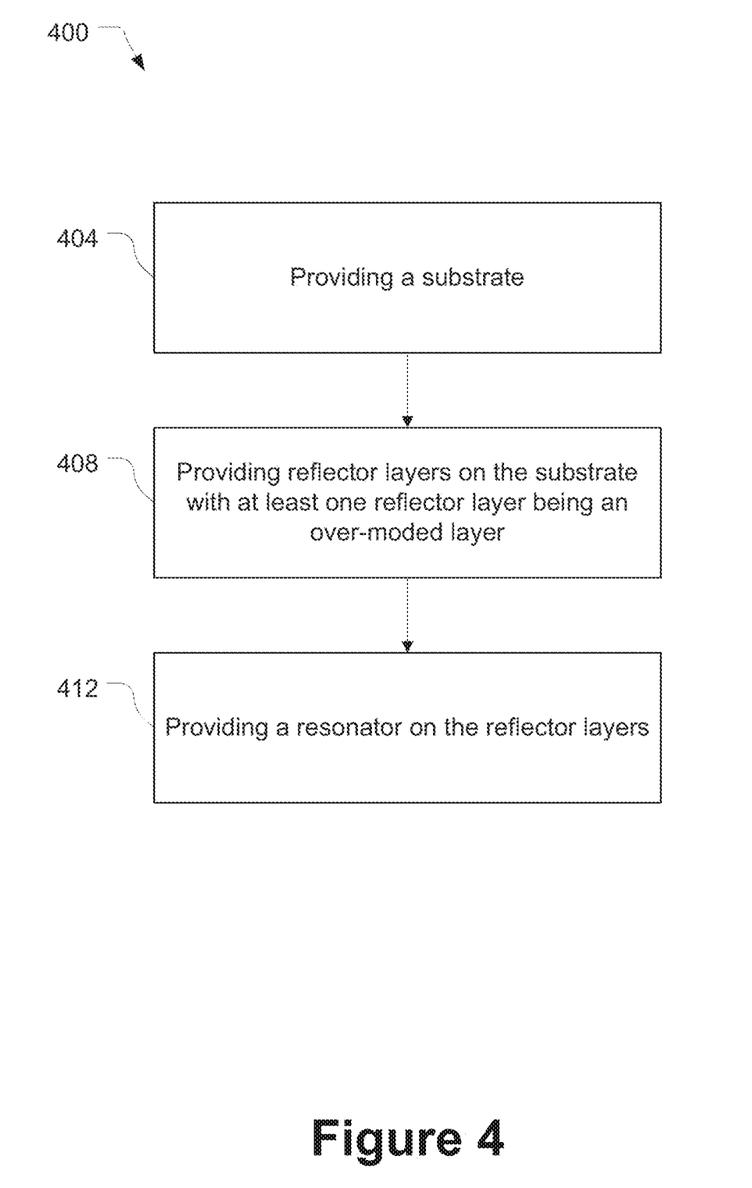
FIG. 4 illustrates a flowchart depicting a manufacturing operation of a temperature-compensated bulk acoustic wave device in accordance with some embodiments.

FIG. 4 illustrates a flowchart 400 that describes a manufacturing operation in accordance with some embodiments. In some embodiments, the manufacturing operation may result in the BAW device 100 or 200.

At 404, the operation may include providing a substrate. The substrate may include any of a variety of materials including, but not limited to, quartz, glass, alumina, sapphire, and silicon.

At 408, the operation may include forming reflector layers on the substrate. As discussed above, the reflector layers may include alternating low and high acoustic impedance layers. In some embodiments, the low acoustic impedance reflector layers may include SiO2, while the high acoustic impedance reflector layers may include W. In some embodiments, the acoustic reflectors may include Al-alloys, AlN, carbon-doped SiO2, fluorinated SiO2, Molybdenum (Mo), diamond-like carbon (DLC), Tantalum Oxide (Ta205), and Hafnium Oxide (HfO2).

At least one of the reflector layers may be an over-moded layer. In some embodiments, one or more of the low acoustic impedance layers may be the over-moded layers. In various embodiments, the topmost reflector layer may be over-moded with or without one or more additional over-moded layers. As described herein, an over-moded reflector layer may be formed by forming the layer with a thickness that is greater than approximately ½ wavelength and, in some embodiments, between approximately ¾ wavelength and ⅘ wavelength.

In various embodiments, the reflector layers may be formed by growing, depositing, sputtering or by some other suitable manufacturing process.

At 412, the operation may include forming a resonator on the reflector layers. Forming the resonator may include forming one or more layers of a bottom electrode on the topmost reflector layer, forming a piezoelectric layer on the bottom electrode, and forming one or more layers of a top electrode on the piezoelectric layer.

In various embodiments, the resonator layers may be formed by growing, depositing, sputtering or by some other suitable manufacturing process. The order of the layers of the resonator and of the reflector may be similar to that of non-TC SMR BAW devices. Thus, the interfaces between the layers may also be similar, which may allow for the use of similar manufacturing processes.

In various embodiments, the one or more layers of the electrodes may include W and AlCu layers and the piezoelectric layer may include AlN. Other embodiments may utilize other materials for the resonator layers.

Figure 5:
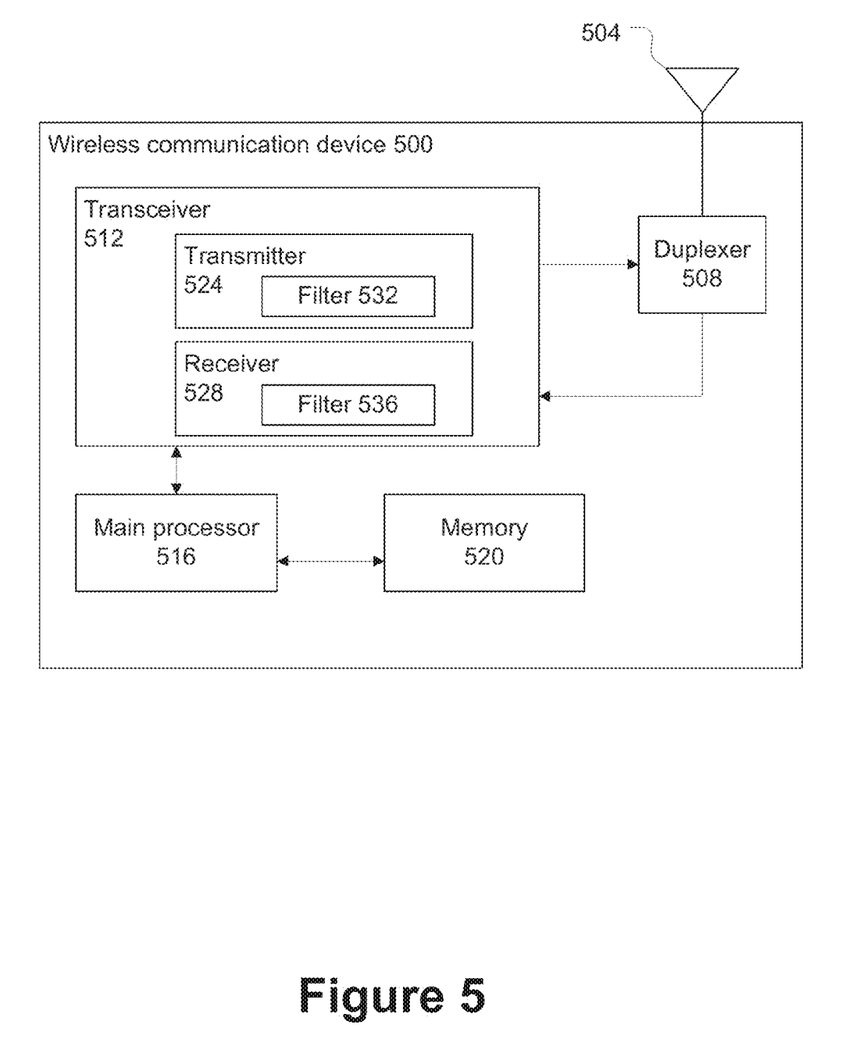
FIG. 5 illustrates a wireless communication device in accordance with some embodiments.

Temperature-compensated BAW devices, such as BAW devices 100 or 200, may be implemented in filters that may be used in a number of embodiments including, for example, a wireless communication device 500 as shown in FIG. 5 in accordance with some embodiments. In various embodiments, the wireless communication device 500 may be, but is not limited to, a mobile telephone, a paging device, a personal digital assistant, a text-messaging device, a portable computer, a base station, a radar, a satellite communication device, or any other device capable of wirelessly transmitting and/or receiving RF signals.

The wireless communication device 500 may have an antenna structure 504, a duplexer 508, a transceiver 512, a main processor 516, and a memory 520 coupled with each other at least as shown.

The main processor 516 may execute a basic operating system program, stored in the memory 520, in order to control the overall operation of the wireless communication device 500. For example, the main processor 516 may control the reception of signals and the transmission of signals by the transceiver 512. The main processor 516 may be capable of executing other processes and programs resident in the memory 520 and may move data into or out of memory 520, as desired by an executing process.

The transceiver 512 may include a transmitter 524 for transmitting RF signals, communicating outgoing data, through the duplexer 508 and antenna structure 504. The transceiver 512 may additionally/alternatively include a receiver 528 for receiving RF signals, communicating incoming data, from the duplexer 508 and antenna structure 504. The transmitter 524 and receiver 528 may include respective filters 532 and 536. The filters 532 and 536 may have selected temperature-compensated BAW devices to benefit the functions to which the respective filter is employed. For example, in some embodiments, the filters 532 and 536 may be ladder filters that include one or more series BAW devices coupled with one or more parallel, or shunt, BAW devices.

In various embodiments, the antenna 504 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A bulk acoustic wave (BAW) device comprising:
a first electrode;
a second electrode;
a piezoelectric layer coupled with and between the first and second electrodes; and
a reflector stack coupled with the second electrode and having a reflector layer to provide temperature compensation, the reflector layer having a thickness that is between approximately ¾ acoustic longitudinal wavelength and ⅘ of the acoustic longitudinal wavelength at a frequency of a main resonance of the BAW device.

2. The BAW device of claim 1, wherein the reflector layer comprises a silicon dioxide layer.

3. The BAW device of claim 2, wherein the BAW device is a solidly mounted resonator (SMR) and the reflector layer includes alternating silicon dioxide and tungsten layers.

4. The BAW device of claim 3, wherein the reflector layer is a topmost layer of the reflector stack.

5. A bulk acoustic wave (BAW) device comprising:
a first electrode;
a second electrode;
a piezoelectric layer coupled with and between the first and second electrodes; and a reflector stack coupled with the second electrode and having a reflector layer to provide temperature compensation, the reflector layer having a thickness that is at least half of an acoustic longitudinal wavelength at a frequency of a main resonance of the BAW device, wherein the reflector layer is configured to include approximately 30% of an energy of an acoustic wave in the BAW device.

6. A bulk acoustic wave (BAW) device comprising:
a first electrode;
a second electrode;
a piezoelectric layer coupled with and between the first and second electrodes; and
a reflector stack coupled with the second electrode and having a reflector layer to provide temperature compensation, the reflector layer having a thickness that is at least half an acoustic longitudinal wavelength at a frequency of a main resonance of the BAW device, wherein the reflector layer is a topmost layer of the reflector stack and the reflector stack further includes another reflector layer that has a thickness at least half of the acoustic longitudinal wavelength.

7. A bulk-acoustic wave (BAW) device comprising:
a resonator with a pair of electrodes and a piezoelectric layer;
and a reflector stack coupled with the resonator, the reflector stack including a topmost layer that is in an over-moded configuration that is to provide a plurality of mirror modes.

8. The BAW device of claim 7, wherein the topmost layer is configured to include approximately 20% or more of energy of an acoustic wave in the BAW device.

9. The BAW device of claim 8, wherein the topmost layer is configured to include approximately 30% of the energy of the acoustic wave in the BAW device.

10. The BAW device of claim 7, wherein the topmost layer has a thickness that is at least half of an acoustic longitudinal wavelength at a frequency of a main resonance of the BAW device.

11. The BAW device of claim 10, wherein the thickness is between approximately ¾ of the acoustic longitudinal wavelength and ⅘ of the acoustic longitudinal wavelength.

12. The BAW device of claim 7, wherein the topmost layer comprises a silicon dioxide layer.

13. The BAW device of claim 7, wherein the BAW device is a solidly mounted resonator (SMR) and the reflector stack includes alternating silicon dioxide and tungsten layers.

14. The BAW device of claim 7, wherein the reflector stack includes another layer that is in an over-moded configuration.

15. The BAW device of claim 14, wherein the other layer that is in an over-moded configuration is to facilitate a reduction of a magnitude of mirror modes in the BAW device.

16. The BAW device of claim 7, wherein the topmost reflector layer has a first acoustical impedance and another layer of the reflector stack has a second acoustical impedance that is greater than the first acoustical impedance.

17. The BAW device of claim 15, wherein the reflector stack includes alternating layers of first acoustical impedance and second acoustical impedance.

18. A system comprising:
an antenna structure;
a transceiver coupled with the antenna structure and configured to receive or transmit radio frequency signals, the transceiver including a filter that has a temperature compensated bulk acoustic wave (BAW) device having:
a resonator configured to convert energy between an acoustic wave form and an electrical form; and
a reflector coupled with the resonator and having a temperature compensating layer that is configured to have approximately 20% or more of energy of an acoustic wave in the BAW device.

19. The system of claim 18, wherein the temperature compensating layer has a thickness that is at least half of an acoustic longitudinal wavelength at a frequency of a main resonance of the BAW device.

20. The system of claim 18, wherein the reflector includes another temperature compensating layer that has a thickness of at least half of the acoustic longitudinal wavelength.

21. A method of manufacturing a bulk acoustic wave (BAW) device comprising:
providing a substrate;
forming a plurality of reflector layers on the substrate, wherein a topmost reflector layer has a thickness that is between approximately ¾ of an acoustic longitudinal wavelength and ⅘ of the acoustic longitudinal wavelength at a frequency of a main resonance of the BAW device; and
forming a resonator on the topmost reflector layer.

22. A method of manufacturing a bulk acoustic wave (BAW) device comprising:
providing a substrate;
forming a plurality of reflector layers on the substrate, wherein a topmost reflector layer has a thickness that is at least half of an acoustic longitudinal wavelength at a frequency of a main resonance of the BAW device and another reflector layer with a thickness that is at least half of the acoustic longitudinal wavelength; and
forming a resonator on the topmost reflector layer.

* * * * *

UNITED STATES PATENT AND TRADEMARK OFFICE
CERTIFICATE OF CORRECTION

PATENT NO.         : 9,219,517 B2
APPLICATION NO.    : 14/044782
DATED              : December 22, 2015
INVENTOR(S)        : Robert Aigner and Alireza Tajic It is certified that error appears in the above-identified patent and that said Letters Patent is hereby corrected as shown below:

In the Specification:

In column 2, line 3, replace ""NB"" with --"A/B"--.

In the Claims:

In claim 1, column 7, line 17, replace "¾" with --¾ of an--.

In claim 6, column 7, line 47, replace "half an" with --half of an--.

Signed and Sealed this
Nineteenth Day of April, 2016

Michelle K. Lee
*Director of the United States Patent and Trademark Office*